United States Patent
Hao (10) Patent No.: US 9,672,936 B2
(45) Date of Patent: Jun. 6, 2017

(54) DRIVING CIRCUITS AND THE SHIFT REGISTER CIRCUITS

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Sikun Hao, Guangdong (CN)

(73) Assignee: Shenzhen China Star Optoelectronics Technology Co., Ltd, Shenzhen (CN)

(*) Notice: Subject to any disclaimer, the term of this patent is extended or adjusted under 35 U.S.C. 154(b) by 40 days.

(21) Appl. No.: 14/775,719

(22) PCT Filed: Aug. 12, 2015

(86) PCT No.: PCT/CN2015/086737
§ 371 (c)(1),
(2) Date: Sep. 13, 2015

(87) PCT Pub. No.: WO2017/020332
PCT Pub. Date: Feb. 9, 2017

(65) Prior Publication Data
US 2017/0040068 A1    Feb. 9, 2017

(30) Foreign Application Priority Data
Aug. 5, 2015   (CN) .......................... 2015 1 0475825

(51) Int. Cl.
| G11C 19/28 | (2006.01) |
| H03K 19/20 | (2006.01) |
| H03K 19/00 | (2006.01) |
| G09G 3/36  | (2006.01) |

(52) U.S. Cl.
CPC .......... *G11C 19/28* (2013.01); *G09G 3/3674* (2013.01); *H03K 19/0013* (2013.01); *H03K 19/20* (2013.01); *G09G 2310/0286* (2013.01); *G09G 2310/08* (2013.01)

(58) Field of Classification Search
CPC ..................................................... G11C 19/28
See application file for complete search history.

(56) References Cited

U.S. PATENT DOCUMENTS

| 5,239,206 A * | 8/1993 | Yanai ..................... G11C 19/28 327/141 |
| 6,765,980 B2 * | 7/2004 | Azuma ................ G11C 19/282 345/100 |
| 7,756,238 B2 * | 7/2010 | Chen ..................... G11C 19/00 377/64 |

* cited by examiner

Primary Examiner — Hai L Nguyen
(74) Attorney, Agent, or Firm — Andrew C. Cheng (57) ABSTRACT

A driving circuit and a shift register circuit are disclosed. The driving circuit includes a plurality of cascaded multi-stages shift register circuits. Each of the shift register circuit includes a transmission door latch circuit and a signal transmission circuit. The transmission door latch circuit includes a transmission door, first clock signals triggering the transmission door such that transmission signals of two stages ahead are transmitted to the signal transmission circuit via the transmission door to generate transmission signals for the current stage. Second clock signals control the transmission signals of the current stage to pass through the signal transmission circuit to generate gate driving signals for the current stage. In this way, the driving circuit is feasible for CMOS manufacturing process, and owns the advantages such as low power consumption and high noise tolerance.

13 Claims, 5 Drawing Sheets

DRIVING CIRCUITS AND THE SHIFT REGISTER CIRCUITS

BACKGROUND OF THE INVENTION

1. Field of the Invention

The present disclosure relates to liquid crystal display technology, and more particularly to a driving circuit and a shift register circuit.

2. Discussion of the Related Art

GOA (Gate Driver On Array) relates to the technology of manufacturing gate scanning driving circuit on the array substrate using the conventional array manufacturing process of current LCDs, which realizes the row-scanning driving method. This solution is capable of reducing the manufacturing cost and may achieve narrow border design, and thus is adopted by a variety of display devices. There are two functions of GOA circuit. First one relates to inputting gate driving pulse to drive the gate lines within the panels so as to turn on the thin film transistors (TFTs) within the display area, and the pixels are charged by the gate lines. The second one relates to shift register. When the n-th gate driving pulse is outputted, the output of the (n+1)-th gate driving pulse may be controlled by clocks, and then may be passed on.

The GOA circuit includes pull-up circuit, pull-up control circuit, pull-down circuit, pull-down control circuit, and boost circuit for raising the level. Specifically, the pull-up circuit outputs the inputted Clock to the gate of the TFT, which operates as the driving signals of the LCD. The pull-up control circuit is configured to turn on the pull-up circuit, which is generally triggered by the signals transmitted from the GOA circuit at a higher level. The pull-down circuit is configured for pulling down the scanning signals to the low level after the scanning signals are outputted. That is, the level of the gate of the TFT is pulled down to be low level. The pull-down control circuit is configured for keeping the state of the scanning signals and the pull-up circuits (usually referred to as Q point) as turn-off, which is the configured negative level. Usually, two pull-down control circuits are configured such that the circuit may be alternated. The pull-up circuit is configured for the second uplift for the level of the Q point, which ensures the G(N) of the pull-up circuit may output normally.

Different GOA circuits may adopt different manufacturing processes. Low Temperature Poly-silicon (LTPS) has the advantages such as high electron mobility rate and mature technology, and thus has been widely adopted by display devices of small and medium size. Complementary Metal Oxide Semiconductor (CMOS) LTPS manufacturing process has the advantages such as low power consumption, high electron mobility rate, high noise tolerance, and so on, and thus has been gradually adopted by panel suppliers, and thus the GOA circuits corresponding to the CMOS LTPS manufacturing process has to be developed accordingly.

SUMMARY

In the present disclosure, the driving circuit and the shift register circuit are configured for the CMOS manufacturing process, and also are characterized by the attributes such as low power consumption and high noise tolerance.

In one aspect, a driving circuit includes: a plurality of cascaded multi-stages shift register circuits, each of the shift register circuit comprising a transmission door latch circuit and a signal transmission circuit, the transmission door latch circuit comprising a transmission door, first clock signals triggering the transmission door such that transmission signals of two stages ahead being transmitted to the signal transmission circuit via the transmission door to generate transmission signals for the current stage; second clock signals controlling the transmission signals of the current stage to pass through the signal transmission circuit to generate gate driving signals for the current stage; and wherein the transmission door latch circuit and the signal transmission circuit being trigger at a rising edge, and the first clock signals being shifted for haft the clock duration to obtain the second clock signals.

Wherein the transmission door latch circuit comprises at least a first inverter, the first clock signals connect to a first control end of the transmission door, and the first clock signals pass through the first inverter to connect to a second control end of the transmission door.

Wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the two stages ahead pass through the transmission door, the second inverter, and the third inverter in turn and are outputted to the signal transmission circuit so as to generate the transmission signals for the current stage.

Wherein the signal transmission circuit comprises at least a NAND gate, the second clock signals control the transmission signals for the current stage to pass the NAND gate to generate the gate driving signals.

Wherein the signal transmission circuit comprises a multi-cascaded inverter circuit being connected with the output end of the NAND gate.

Wherein the multi-cascaded inverter circuit comprises three inverters.

Wherein a difference between the clock durations of the adjacent shift register circuits is substantially ¼ clock duration.

In another aspect, a driving circuit includes: a plurality of cascaded multi-stages shift register circuits, each of the shift register circuit comprising a transmission door latch circuit and a signal transmission circuit, the transmission door latch circuit comprising a transmission door, first clock signals triggering the transmission door such that transmission signals of two stages ahead being transmitted to the signal transmission circuit via the transmission door to generate transmission signals for the current stage; and second clock signals controlling the transmission signals of the current stage to pass through the signal transmission circuit to generate gate driving signals for the current stage.

Wherein the transmission door latch circuit and the signal transmission circuit being trigger at a rising edge.

Wherein the transmission door latch circuit comprises at least a first inverter, the first clock signals connect to a first control end of the transmission door, and the first clock signals pass through the first inverter to connect to a second control end of the transmission door.

Wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the two stages ahead pass through the transmission door, the second inverter, and the third inverter in turn and are outputted to the signal transmission circuit so as to generate the transmission signals for the current stage.

Wherein the signal transmission circuit comprises at least a NAND gate, the second clock signals control the transmission signals for the current stage to pass the NAND gate to generate the gate driving signals.

Wherein the signal transmission circuit comprises a multi-cascaded inverter circuit being connected with the output end of the NAND gate.

Wherein the multi-cascaded inverter circuit comprises three inverters.

Wherein the first clock signals are shifted for haft the clock duration to obtain the second clock signals.

Wherein a difference between the clock durations of the adjacent shift register circuits is substantially ¼ clock duration.

In another aspect, a shift register circuit includes: a transmission door latch circuit and a signal transmission circuit, the transmission door latch circuit comprising a transmission door, first clock signals triggering the transmission door such that transmission signals of two stages ahead being transmitted to the signal transmission circuit via the transmission door to generate transmission signals for the current stage; and second clock signals controlling the transmission signals of the current stage to pass through the signal transmission circuit to generate gate driving signals for the current stage.

Wherein the transmission door latch circuit comprises at least a first inverter, the first clock signals connect to a first control end of the transmission door, and the first clock signals pass through the first inverter to connect to a second control end of the transmission door.

Wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the two stages ahead pass through the transmission door, the second inverter, and the third inverter in turn and are outputted to the signal transmission circuit so as to generate the transmission signals for the current stage.

Wherein the signal transmission circuit comprises at least a NAND gate, the second clock signals control the transmission signals for the current stage to pass the NAND gate to generate the gate driving signals.

In view of the above, the driving circuit includes cascaded multi-stages shift register circuit. Each of the shift register circuit includes a transmission door latch circuit and a signal transmission circuit. The transmission door latch circuit includes a transmission door being triggered by first clock signals such that transmission signals of two stages ahead being transmitted to the signal transmission circuit via the transmission door to generate transmission signals for the current stage. This configuration is feasible for the CMOS manufacturing process, and owns the advantages of low power consumption and high noise tolerance.

DETAILED DESCRIPTION OF THE EMBODIMENTS

Embodiments of the invention will now be described more fully hereinafter with reference to the accompanying drawings, in which embodiments of the invention are shown.

Figure 1:
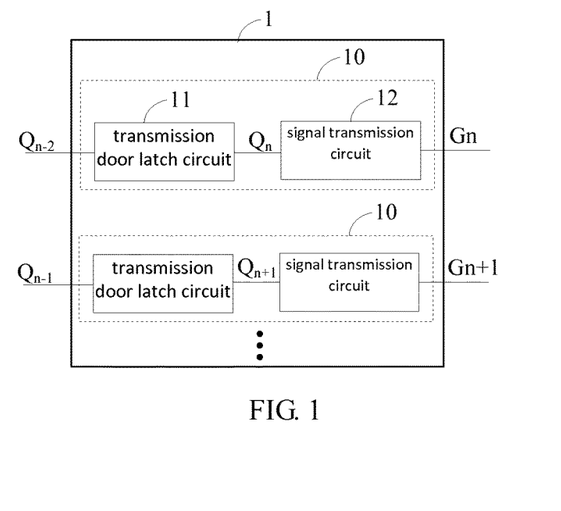
FIG. 1 is a schematic view of the driving circuit in accordance with one embodiment.

FIG. 1 is a schematic view of the driving circuit in accordance with one embodiment. As shown in FIG. 1, the driving circuit 1 includes a plurality of cascaded multi-stages shift register circuits 10. Each of the shift register circuit 10 includes a transmission door latch circuit 11 and a signal transmission circuit 12. The transmission door latch circuit 11 includes a transmission door, and first clock signals triggers the transmission door.

The transmission signals of the two stages ahead ($Q_{n-2}$) are transmitted to the signal transmission circuit 12 via the transmission door to generate the transmission signals for the current stage ($Q_n$).

The second clock signals controls the transmission signals for the current stage ($Q_n$) to pass through the signal transmission circuit 12 to generate the gate driving signals ($G_n$) for the current stage. The transmission door latch circuit 11 and the signal transmission circuit 12 are triggered at the rising edge. In the embodiment, the transmission door latch circuit 11 latches the signals, and the signal transmission circuit 12 controls the transmission of the signals to generate gate driving signals such that the circuit is feasible for CMOS manufacturing process, and owns the advantages such as low power consumption and high noise tolerance.

Figure 2:
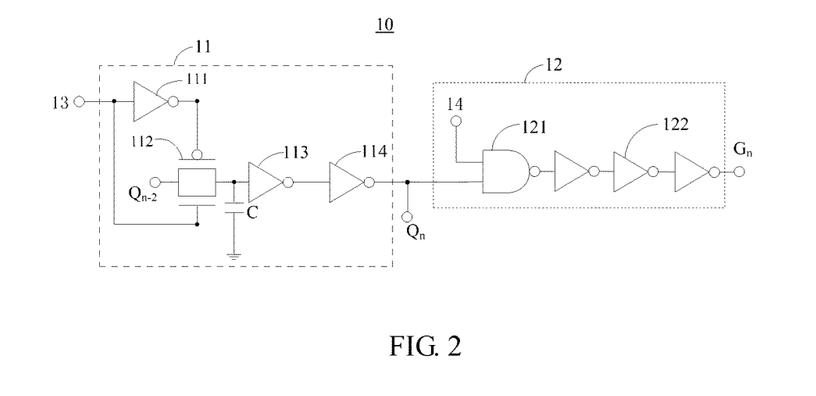
FIG. 2 is a circuit diagram of the shift register circuit of FIG. 1.

In the embodiment, as shown in FIG. 2, the transmission door latch circuit 11 includes, at least, a first inverter 111. The first clock signals 13 connects to the first control end of the transmission door 112. The first clock signals 13 passes through the first inverter 111 to connect to the second control end of the transmission door 112.

The transmission door latch circuit 11 further includes a capacitor (C), a second inverter 113, and a third inverter 114. One end of the capacitor (C) connects to the output end of the transmission door 112, and the other end of the capacitor (C) is grounded. The second inverter 113 and the third inverter 114 are cascaded at the output end of the transmission door 112. The transmission signals of the previous two stages ($Q_{n-2}$) pass through the transmission door 112, the second inverter 113, the third inverter 114, and the signal transmission circuit 12 so as to generate the transmission signals for the current stage ($Q_n$) to latch the signals.

The signal transmission circuit 12 includes, at least, a NAND gate 121 and a multi-cascaded inverter circuit 122. The second clock signals 14 control the transmission signals for the current stage ($Q_n$) to pass the NAND gate 121 to generate the gate driving signals ($G_n$). That is, the latched signals are formed to be the gate driving signals, which are then transmitted to the corresponding gate. The multi-cascaded inverter circuit 122 connects to the output end of the NAND gate 121 to enhance the driving capability of the driving circuit 1. The multi-cascaded inverter circuit 122, preferably, includes three inverters being cascaded configured. The first clock signals 13 are shifted for ½ clock duration to obtain the second clock signals 14.

Figure 3:
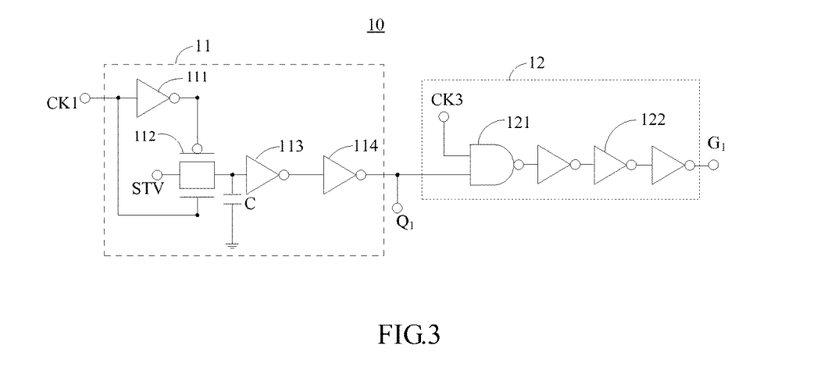
FIG. 3 is a circuit diagram of the shift register circuit in the first stage of FIG. 1.

The driving circuit 1 includes the shift register circuit 10 at an initial stage and the shift register circuits 10 at the general stages. The shift register circuit 10 at the initial stage includes the shift register circuits 10 at the first and the second stage. As shown in FIG. 3, with respect to the shift register circuit 10 at the first stage, the first clock signals 13 is shown as clock (CK1) and the second clock signals 14 is shown as clock (CK3). The input end of the transmission door 112 connects with a start voltage (STV) pulse. The clock (CK1) at the rising edge controls the first control end of the transmission door 112. The clock (CK1) passes through the first inverter 111 to control the second control end of the transmission door 112. The output end of the third inverter 114 outputs the driving pulse ($Q_1$) of the Q point of the first stage so as to latch the signals. When the clock (CK3) is at the rising edge, the output end of the multi-cascaded inverter circuit 122 outputs the gate driving signals ($G_1$) at the first stage, which generates the gate driving signals in accordance with the latched signals and then the gate driving signals are transmitted to the corresponding gate.

Figure 4:
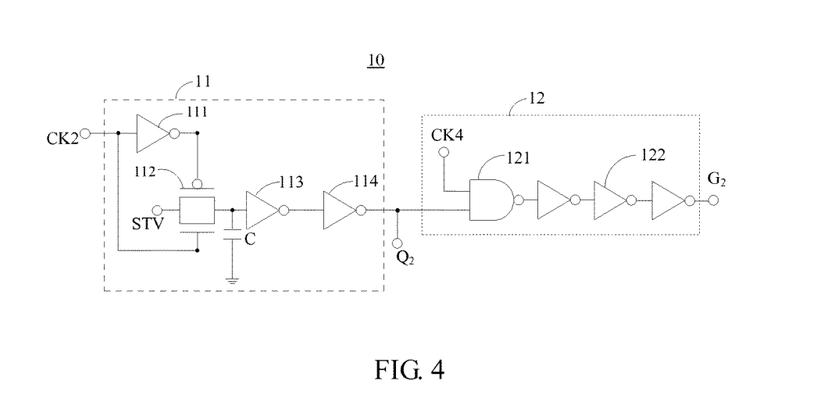
FIG. 4 is a circuit diagram of the shift register circuit in the second stage of FIG. 1.

The difference between the clock durations of the CK3 and CK1 is half the clock duration, which may be obtained by shifting the clock (CK1) forward or backward for ½ clock duration. As shown in FIG. 4, the shift register circuit 10 at the second stage, the first clock signals 13 are shown as clock (CK2) and the second clock signals 14 are shown as clock (CK4). The input end of the transmission door 112 connects with the STV pulse, and the output end of the third inverter 114 connects with the driving pulse ($Q_2$) of the Q point at stage two. The output end of the multi-cascaded inverter circuit 122 outputs the gate driving signals ($G_2$). The difference between the clock durations of the clock (CK3). And the clock (CK1) is half the clock duration, which may be obtained by shifting the clock (CK1) forward or backward for ½ clock duration. The difference between the clock durations of the adjacent shift register circuits is ¼ clock duration. Specifically, the difference between the clock (CK2) and the clock (CK1) is ¼ clock duration, which may be obtained by shifting the clock (CK1) backward for ¼ clock duration, or by shifting the clock (CK1) forward for ¾ clock duration. Correspondingly, the clock (CK4) may be obtained by shifting the clock (CK1) backward for ¾ clock duration or by shifting the clock (CK1) forward for ¼ clock duration.

Figure 5:
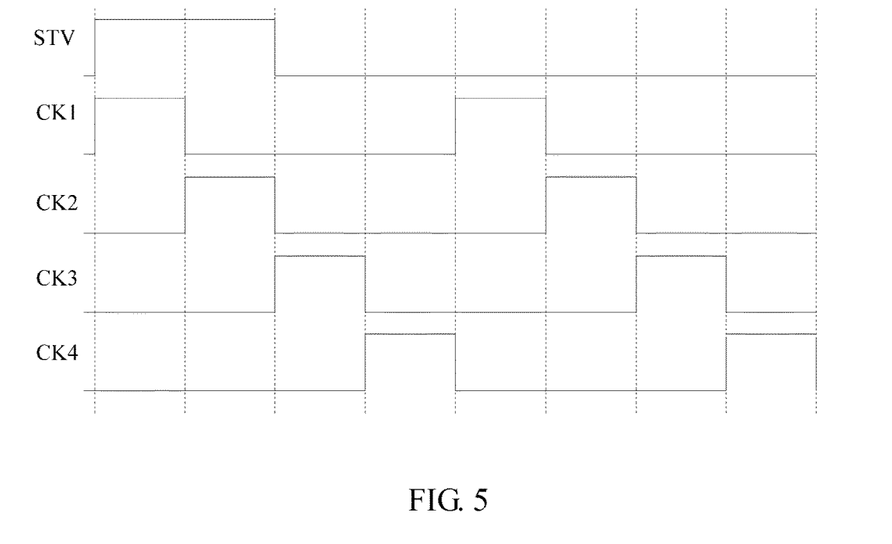
FIG. 5 is a timing diagram of the shift register circuits in the first and in the second stages of FIG. 1.

FIG. 5 is an theoretical timing diagram of the STV pulse and the clock (CK1, CK2, CK3, and CK4) of FIGS. 3 and 4, wherein the Y-axis relates to the voltage, and the X-axis relates to the time. With respect to the shift register circuit 10 at the first stage, when the clock (CK1) is at the rising edge, the transmission door latch circuit 11 triggers the transmission door 112 to be turned on. The transmission door 112 transmits the STV pulse to the second inverter 113, and then the STV pulse is transmitted to the driving pulse ($Q_2$) of the Q point at the first stage. The STV pulse is at high level, and the driving pulse ($Q_1$) of the Q point of the first stage is also at the high level. When the clock (CK3) is at the rising edge, the clock (CK3) triggers the NAND gate 121 of the driving circuit 1. The driving pulse ($Q_1$) of the Q point of the first stage passes through the NAND gate 121 and the multi-cascaded inverter circuit 122 and are then transmitted to the gate driving signals ($G_1$) at the first stage. At this moment, the gate driving signals ($G_1$) at the first stage is also at the high level. With respect to the shift register circuit 10 at the second stage, when the clock (CK2) is at the rising edge, the transmission door latch circuit 11 triggers the transmission door 112 to be turned on. The transmission door 112 transmits the STV pulse to the second inverter 113, and the STV pulse is then transmitted to the driving pulse ($Q_2$) of the Q point of the second stage via the third inverter 114. The STV pulse is at high level, and the driving pulse ($Q_2$) of the Q point of is also at the high level. When the clock (CK4) is at the rising edge, the clock (CK4) triggers the NAND gate 121 of the driving circuit 1. The driving pulse ($Q_2$) of the Q point passes through the NAND gate 121 and the multi-cascaded inverter circuit 122 and is then transmitted to the gate driving signals ($G_2$) at the second stage. At this moment, the gate driving signals ($G_2$) at the second stage is also at the high level.

Figure 6:
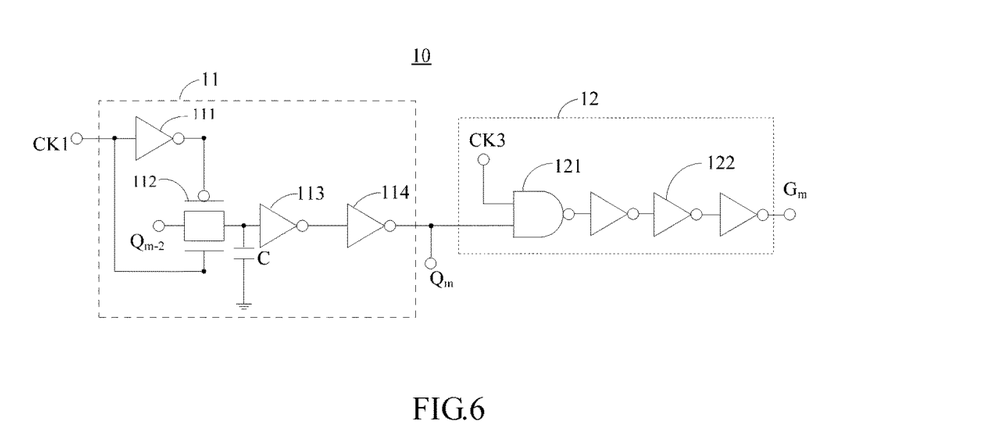
FIG. 6 is a circuit diagram of the shift register circuit in the m-th stage of FIG. 1.

The shift register circuit 10 at the general stages relates to the shift register circuit 10 at the third stage or the shift register circuit 10 being arranged at the stage higher than three. As shown in FIG. 6, with respect to the shift register circuit 10 at the m-th stage, wherein m equals to n and n is larger than or equal to 3, the first clock signals is the clock (CK1), and the second clock signals is the clock (CK3). The input end of the transmission door 112 connects to the Q point ($Q_{m-2}$) arranged at two first stages ahead. When the clock (CK1) is at the rising edge, the output end of the third inverter 114 outputs the driving pulse ($Q_m$) of the Q point of the m-th stage. When the clock (CK3) is at the rising edge, the output end of the multi-cascaded inverter circuit 122 outputs the gate driving signals ($G_m$) of the m-th stage, wherein the difference between the clock durations of the CK3 and CK1 is half the clock duration.

Figure 7:
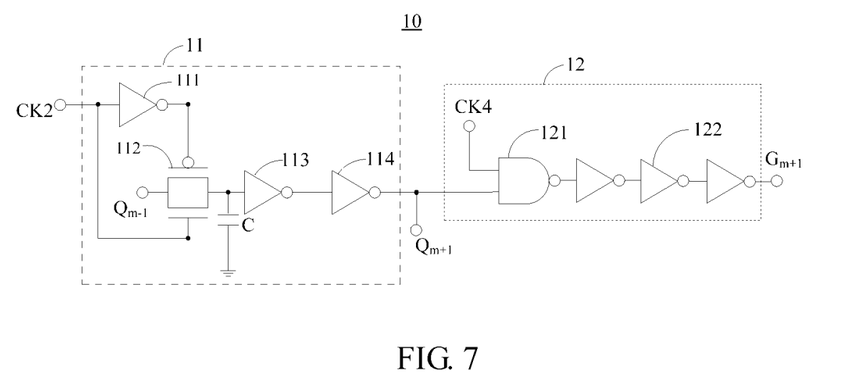
FIG. 7 is a circuit diagram of the shift register circuit in the (m+1)-th stage of FIG. 1.

As shown in FIG. 7, with respect to the shift register circuit 10 at the (m+1)-th stage, the first clock signals are the clock (CK2), the second clock signals are the clock (CK4). The input end of the transmission door 112 connects to the Q point ($Q_{m-1}$) arranged at two first stages ahead. When the clock (CK2) is at the rising edge, the output end of the third inverter 113 outputs the driving pulse ($Q_{m+1}$) of the Q point of the (m+1)-th stage. When the clock (CK4) is at the rising edge, the output end of the multi-cascaded inverter circuit 122 outputs the gate driving signals ($G_{m+1}$) of the (m+1)-th stage, wherein the difference between the clock durations of the CK4 and CK2 is half the clock duration. In addition, the difference between the clock durations of the CK2 and the CK1 is a quarter of the clock duration.

Figure 8:
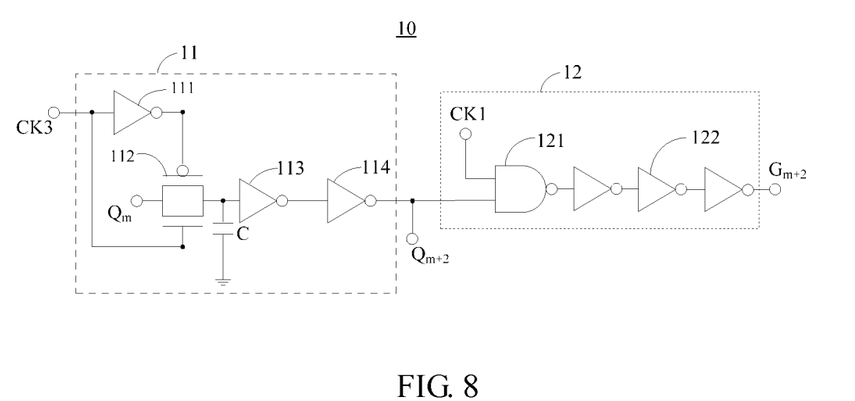
FIG. 8 is a circuit diagram of the shift register circuit in the (m+2)-th stage of FIG. 1.

As shown in FIG. 8, with respect to the shift register circuit 10 at the (m+2)-th stage, the first clock signals are the clock (CK3), the second clock signals are the clock (CK1). The input end of the transmission door 112 connects to the Q point ($Q_m$) arranged at two first stages ahead. When the clock (CK3) is at the rising edge, the output end of the third inverter 114 outputs the driving pulse ($Q_{m+2}$) of the Q point of the (m+2)-th stage. When the clock (CK1) is at the rising edge, the output end of the multi-cascaded inverter circuit 122 outputs the gate driving signals ($G_{m+2}$) of the (m+2)-th stage.

Figure 9:
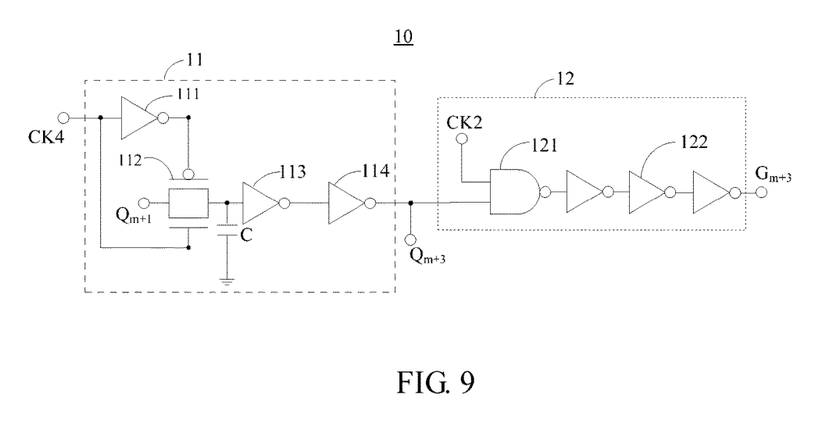
FIG. 9 is a circuit diagram of the shift register circuit in the (m+3)-th stage of FIG. 1.

As shown in FIG. 9, with respect to the shift register circuit 10 at the (m+3)-th stage, the first clock signals are the clock (CK4), the second clock signals are the clock (CK2).

Figure 10:
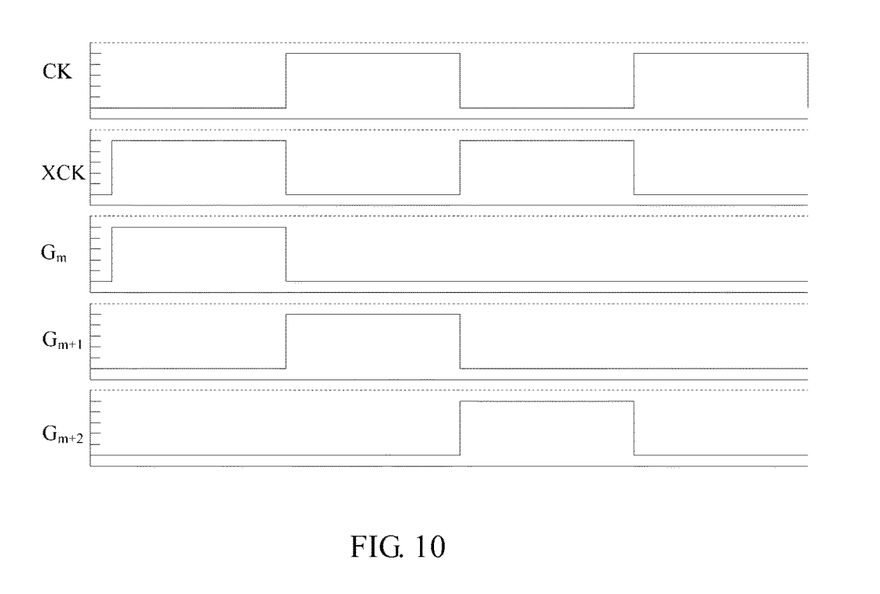
FIG. 10 is a simulated timing diagram of the driving circuit in accordance with one embodiment.

The input end of the transmission door 112 connects to the Q point ($Q_{m+1}$) arranged at two first stages ahead. When the clock (CK4) is at the rising edge, the output end of the third inverter 113 outputs the driving pulse ($Q_{m+3}$) of the Q point of the (m+3)-th stage. When the clock (CK2) is at the rising edge, the output end of the multi-cascaded inverter circuit 122 outputs the gate driving signals ($G_{m+3}$) of the (m+3)-th stage, FIG. 10 is a simulated timing diagram of the driving circuit in accordance with one embodiment, wherein the Y-axis relates to the voltage, and the X-axis relates to the time. FIG. 10 shows the clock (CK, XCK) and the gate driving signals ($G_{m-1}$, $G_m$, and $G_{m+1}$) of the shift register circuits 10 from the (m−1)-th stage to the (m+1)-th stage. The timing diagram corresponds to the driving circuit diagram of FIGS. 6-9, wherein the clock (CK1) and the clock (CK2) corresponds to the clock (CK) of FIG. 10, and the clock (CK3) and the clock (CK4) corresponds to the XCK of FIG. 10. It can be seen from the drawings that the simulated timing of the driving circuit is similar to the theoretical timing, which may be feasible for the CMOS manufacturing process and owns the advantages of low power consumption and high noise tolerance at the same time.

According to the present disclosure, the shift register circuit 10 includes the transmission door latch circuit 11 and the signal transmission circuit 12. Referring to FIG. 2, the transmission door latch circuit 11 includes, at least, the transmission door 112, the first inverter 111, the capacitor (C), the second inverter 113, and the third inverter 114. The first clock signals 13 connects with the first control end of the transmission door 112. The first clock signals 13 pass through the first inverter 111 so as to connect to the second control end of the transmission door 112. One end of the capacitor (C) connects to the output end of the transmission door 112, and the other end of the capacitor (C) is grounded. The second inverter 113 and the third inverter 114 are cascaded at the output end of the transmission door 112. When the first clock signals 13 is at the rising edge, the transmission signals of the previous two stages ($Q_{n-2}$) pass through the transmission door 112, the second inverter 113, the third inverter 114, and the signal transmission circuit 12 in turn to form the transmission signals for the current stage ($Q_n$), and the signals are latched.

The signal transmission circuit 12 includes at least the NAND gate 121 and the multi-cascaded inverter circuit 122. The second clock signals 14 and the transmission signals for the current stage ($Q_n$) are respectively the two input ends of the NAND gate 121. The multi-cascaded inverter circuit 122 connects with the output end of the NAND gate 121 to enhance the driving capability of the gate driving signals ($G_n$). That is, the latched signals are formed as the gate driving signals, and are transmitted to the corresponding gate. The multi-cascaded inverter circuit 122, preferably, includes three inverters connected serially. The first clock signals 13 is shifted forward or backward for half the clock period so as to obtain the second clock signals 14. The output end of the third inverter 114 outputs the driving pulse ($Q_n$) of the Q point. The output end of the multi-cascaded inverter circuit 122 outputs the driving pulse ($Q_n$), wherein n is an integer larger than or equals to one.

In view of the above, the transmission door of the transmission door latch circuit 11 is triggered by the first clock signals so as to transmit the transmission signals of the shift register circuit which is two stages ahead to the signal transmission circuit to form the transmission signals for the current shift register circuit. The second clock signals controls the transmission signals for the current shift register circuit to pass through the signal transmission circuit so as to generate the gate driving signals for the current shift register circuit. This configuration is feasible for the CMOS manufacturing process, and owns the advantages of low power consumption and high noise tolerance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A driving circuit, comprising:
a plurality of cascaded multi-stages shift register circuits, each of the shift register circuits comprising a transmission door latch circuit and a signal transmission circuit, the transmission door latch circuit comprising a transmission door, first clock signals triggering the transmission door such that transmission signals of (n−2)-th stage being transmitted to the signal transmission circuit via the transmission door to generate transmission signals for a n-th stage, wherein n is an integer larger than or equals to one;
second clock signals controlling the transmission signals of the n-th stage to pass through the signal transmission circuit to generate gate driving signals for the n-th stage; and
wherein the transmission door latch circuit and the signal transmission circuit being trigger at a rising edge, and the first clock signals being shifted for haft the clock duration to obtain the second clock signals;
wherein the transmission door latch circuit comprises at least a first inverter, the first clock signals connect to a first control end of the transmission door, and the first clock signals pass through the first inverter to connect to a second control end of the transmission door;
wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the (n−2)-th stage pass through the transmission door, the second inverter, the third inverter, and the signal transmission circuit in turn and are outputted to the signal transmission circuit so as to generate the transmission signals for the n-th stage.

2. The driving circuit as claimed in claim 1, wherein the signal transmission circuit comprises at least a NAND gate, the second clock signals control the transmission signals for the n-th stage to pass the NAND gate to generate the gate driving signals.

3. The driving circuit as claimed in claim 2, wherein the signal transmission circuit comprises a multi-cascaded inverter circuit being connected with the output end of the NAND gate.

4. The driving circuit as claimed in claim 3, wherein the multi-cascaded inverter circuit comprises three inverters.

5. The driving circuit as claimed in claim 1, wherein a difference between the clock durations of the adjacent shift register circuits is substantially ¼ clock duration.

6. A driving circuit, comprising:
a plurality of cascaded multi-stages shift register circuits, each of the shift register circuits comprising a transmission door latch circuit and a signal transmission circuit, the transmission door latch circuit comprising a transmission door, first clock signals triggering the transmission door such that transmission signals of (n−2)-th stage being transmitted to the signal transmission circuit via the transmission door to generate transmission signals for a n-th stage, wherein n is an integer larger than or equals to one; and
second clock signals controlling the transmission signals of the n-th stage to pass through the signal transmission circuit to generate gate driving signals for the n-th stage;
wherein the transmission door latch circuit and the signal transmission circuit being trigger at a rising edge;
wherein the transmission door latch circuit comprises at least a first inverter, the first clock signals connect to a first control end of the transmission door, and the first clock signals pass through the first inverter to connect to a second control end of the transmission door;
wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the (n−2)-th stages ahead pass through the transmission door, the second inverter, the third inverter, and the signal transmission circuit in turn and are outputted to the signal transmission circuit so as to generate the transmission signals for the n-th stage.

7. The driving circuit as claimed in claim 6, wherein the signal transmission circuit comprises at least a NAND gate, the second clock signals control the transmission signals for the n-th stage to pass the NAND gate to generate the gate driving signals.

8. The driving circuit as claimed in claim 7, wherein the signal transmission circuit comprises a multi-cascaded inverter circuit being connected with the output end of the NAND gate.

9. The driving circuit as claimed in claim 8, wherein the multi-cascaded inverter circuit comprises three inverters.

10. The driving circuit as claimed in claim 6, wherein the first clock signals are shifted for haft the clock duration to obtain the second clock signals.

11. The driving circuit as claimed in claim 6, wherein a difference between the clock durations of the adjacent shift register circuits is substantially ¼ clock duration.

12. A shift register circuit, comprising:
a transmission door latch circuit and a signal transmission circuit, the transmission door latch circuit comprising a transmission door, first clock signals triggering the transmission door such that transmission signals of (n−2)-th stage being transmitted to the signal transmission circuit via the transmission door to generate transmission signals for a n-th stage, wherein n is an integer larger than or equals to one; and
second clock signals controlling the transmission signals of the n-th stage to pass through the signal transmission circuit to generate gate driving signals for n-th stage;
wherein the transmission door latch circuit comprises at least a first inverter, the first clock signals connect to a first control end of the transmission door, and the first clock signals pass through the first inverter to connect to a second control end of the transmission door;
wherein the transmission door latch circuit further comprises a capacitor, a second inverter, and a third inverter, one end of the capacitor connects to an output end of the transmission door, and the other end of the capacitor is grounded, the second inverter and the third inverter are cascaded at the output end of the transmission door, the transmission signals of the (n−2)-th stage pass through the transmission door, the second inverter, the third inverter, and the signal transmission circuit in turn and are outputted to the signal transmission circuit so as to generate the transmission signals for the n-th stage.

13. The shift register circuit as claimed in claim 12, wherein the signal transmission circuit comprises at least a NAND gate, the second clock signals control the transmission signals for the n-th stage to pass the NAND gate to generate the gate driving signals.

\* \* \* \* \*